United States Patent [19]

Watanabe

[11] Patent Number: 5,528,614
[45] Date of Patent: Jun. 18, 1996

[54] QUANTUM WELL SEMICONDUCTOR LASER DEVICE STRUCTURE

[75] Inventor: Hitoshi Watanabe, Itami, Japan

[73] Assignee: Mitsubishi Denki Kabushiki Kaisha, Tokyo, Japan

[21] Appl. No.: 242,087

[22] Filed: May 12, 1994

[30] Foreign Application Priority Data

May 19, 1993 [JP] Japan .................................. 5-116782

[51] Int. Cl.⁶ ........................................................ H01S 3/19
[52] U.S. Cl. ................................................ 372/45; 372/46
[58] Field of Search ........................................ 372/45, 44

[56] References Cited

U.S. PATENT DOCUMENTS 5,345,464  9/1994  Takamoto .................... 372/46

FOREIGN PATENT DOCUMENTS

| 4350988 | 4/1992 | European Pat. Off. . |
| 0539161 | 4/1993 | European Pat. Off. . |
| 63-46788 | 2/1988 | Japan . |
| 64-7587 | 1/1989 | Japan . |
| 64-55888 | 3/1989 | Japan . |
| 465887 | 3/1992 | Japan . |
| 2131610 | 6/1984 | United Kingdom . |
| WO9303524 | 2/1993 | WIPO . |

OTHER PUBLICATIONS

Rennie et al, "High Temperature (90° C.) CW Operation Of 646nm InGaAlP Laser Containing Multiquantum Barrier", Electronics Letters, vol. 28, No. 2, Jan. 1992, pp. 150–151.

Iga et al, "Electron Reflectance Of Multiquantum Barrier (MQB)", Electronic Letters, vol. 22, No. 19, Sep. 1986, pp. 1008–1009.

Shima, "670nm Window Laser Diode Performs 150mW Signal Transverse–Mode Operation", Journal of Electronics Engineering, vol. 30, No. 313, Jan. 1993, pp. 100–103.

*Primary Examiner*—Rodney B. Bovernick
*Assistant Examiner*—Yisun Song
*Attorney, Agent, or Firm*—Leydig, Voit & Mayer

[57] ABSTRACT

A quantum well type semiconductor laser structure includes light confining layers having an MQB structure including a plurality of semiconductor layers having different compositions laminated alternatingly, the compositions, thicknesses, and number of layers producing an energy barrier higher than the energy barrier inherent to the materials for carriers injected into the active layer, a refractive index distribution in the vicinity of the active layer concentrating the electric field in the active layer, and the quantum barrier layers disposed in contact with the active layer. Therefore, the light confinement in the active layer is increased and the overflow of carriers into the light confinement layer is suppressed whereby the threshold current of the quantum well laser is reduced and the external quantum efficiency is enhanced. A quantum well laser includes, as a barrier layer of an active layer having a multiquantum well structure, a barrier layer having an MQB structure that produces an energy barrier higher than the energy barrier inherent to the materials for carriers injected into the well layer. Therefore, similar effects are obtained.

6 Claims, 16 Drawing Sheets

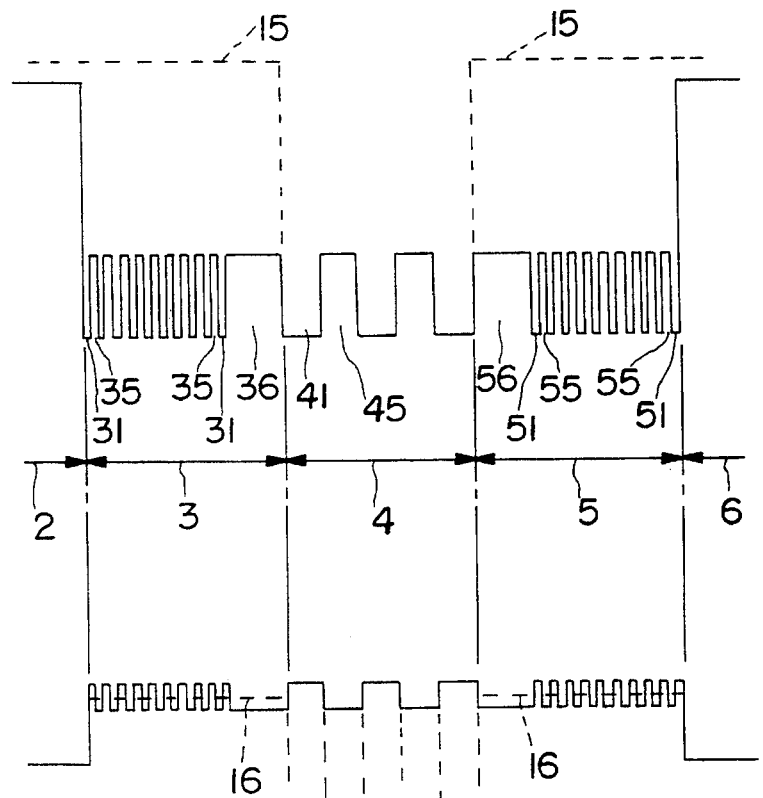
Fig.5(a)
Fig.5(b)
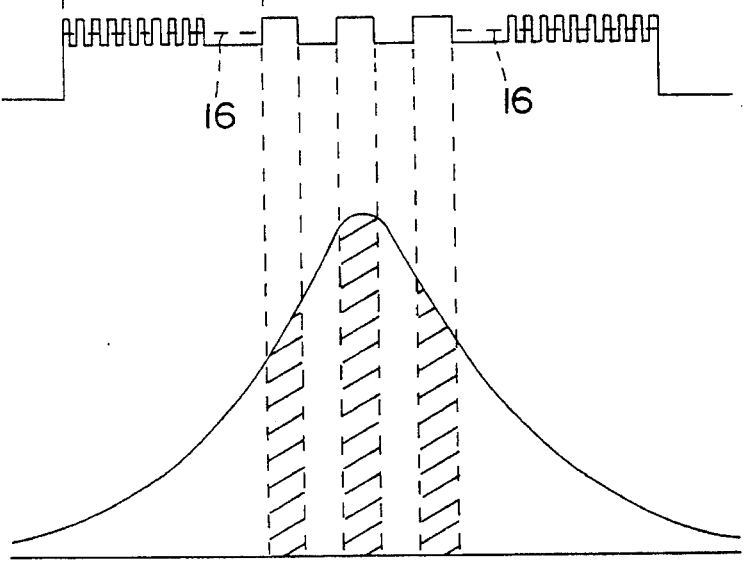
Fig.5(c)

electric field distribution electric field distribution electric field distribution electric field distribution

QUANTUM WELL SEMICONDUCTOR LASER DEVICE STRUCTURE

FIELD OF THE INVENTION

The present invention relates to a quantum well semiconductor laser used in optical communication and, more particularly, to a quantum well semiconductor laser with enhanced dynamic characteristics.

BACKGROUND OF THE INVENTION

It is well known that the performance of semiconductor lasers has been improved tremendously by introducing a quantum well structure into an active layer. The quantum well utilizes the quantum size effect produced by thinning the layer thickness to about a de Broglie wavelength, that is, below about 10 nm (100 Å), and, when it is applied to a semiconductor laser, a single layer or periodic plural layers are introduced into an active layer. In such a quantum well laser, carriers are injected into the quantum well layer, and light generation and recombination occur, thereby producing a tremendously large optical gain relative to a prior art bulk crystal active layer. As a result, lowering of the threshold current, narrowing of spectral linewidth, and enhancement of dynamic characteristics are realized.

FIG. 11 is a diagram showing a structure of a main part of a quantum well semiconductor laser proposed at the beginning of development of a quantum well semiconductor laser. In the figure, reference numeral 110 designates a p type InP substrate. A p type lower cladding layer 120 is disposed on the substrate 110. A multi-quantum well (MQW) structure active layer 140 comprising a plurality of InGaAs well layers and a plurality of InP barrier layers is disposed on the lower cladding layer 120. An n type InP upper cladding layer 160 is disposed on the quantum well active layer 140. An InGaAsP contact layer 170 is disposed on the upper cladding layer 160. A p side electrode 180 is disposed on the rear surface of the substrate 110 and an n side electrode 190 is disposed on the contact layer 170, respectively.

FIGS. 13(a)–13(c) are diagrams for explaining the operation of the MQW semiconductor laser shown in FIG. 11 where FIG. 13(a) is an energy band diagram of the conduction band edge in the vicinity of the active layer, FIG. 13(b) is a diagram showing refractive index corresponding to FIG. 13(a), and FIG. 13(c) is a diagram showing the electric field distribution corresponding to FIG. 13(a). In these figures, the same reference numerals used in FIG. 11 designate the same or corresponding elements as those shown in FIG. 11. Reference numeral 141 designates an InGaAs well layer and reference numeral 142 designates an InP barrier layer. The thickness of the well layer 141 is, for example, about 10 nm (100 Å), the thickness of the barrier layer 142 is, for example, 10 nm (100 Å), and the thicknesses of the lower cladding layer 120 and the upper cladding layer 160 are each, for example, about 1.5 μm.

The electrons injected from the cladding layer 160 into the active layer 140 recombine with holes in the well layers 141, thereby generating light. In the quantum well semiconductor laser shown in FIG. 11, because of the quantum size effect, the carriers injected into the thin well layers 141 exhibit quantum dynamic wave motion so that a quite large optical gain per unit injection current is generated relative to a semiconductor laser having a bulk crystal active layer about 70 to 100 nm (700 to 1000 Å) thick. On the other hand, the threshold current of a laser is represented by the product of optical gain and light confinement. Accordingly, in order to lower the threshold current of a laser, it is important to increase optical gain per unit injection current as well as to increase light confinement.

In the MQW semiconductor laser shown in FIG. 11, while it is possible to increase optical gain per unit injection current as described above, it is impossible to increase light confinement for the following reason. Although the vicinity of the active layer of a quantum well semiconductor laser has a refractive index distribution, as shown in FIG. 13(b), because the active layer (well layer 141) is quite thin, about 5 nm (50 Å), the light generated in the active layer cannot react to the difference in the refractive index between the active layer and the cladding layer. As a result, the electric field distribution is broadened, smoothly, in the layer direction and has only a limited maximum inside the active layer. This is a phenomenon that cannot be seen in a semiconductor laser having a bulk crystal active layer about 70 to 100 nm (700 to 1000 Å) thick. Here, the light confinement is represented by the hatched portion of the electric field distribution in FIG. 13(c). Because the electric field distribution is broadened in the layer thickness direction, it is impossible to increase light confinement in the quantum well layer. Accordingly, in the laser structure of FIG. 11, it is difficult to lower the threshold current.

FIG. 12 is a diagram illustrating a quantum well semiconductor laser structure devised to solve the above-described problems. In the figure, the reference numerals used in FIG. 11 are used to designate the same or corresponding elements. A p type InGaAsP light confinement layer 130 is disposed between the lower cladding layer 120 and the quantum well active layer 140. An n type light confinement layer 150 is disposed between the quantum well active layer 140 and the upper cladding layer 160.

FIGS. 14(a)–14(c) are diagrams for explaining the operation of the MQW semiconductor laser shown in FIG. 12 where FIG. 14(a) is an energy band diagram showing the conduction band edge in the vicinity of the active layer, FIG. 14(b) is a diagram showing the refractive index distribution corresponding to FIG. 14(a), and FIG. 14(c) is a diagram showing the electric field distribution corresponding to FIG. 14(a). In the figures, the reference numerals used in FIG. 12 are used to designate the same or corresponding elements. Reference numeral 141 designates an InGaAs quantum well layer and reference numeral 143 designates an InGaAsP barrier layer.

Electrons injected into the cladding layer 160 diffuse into the light confinement layer 150, are input to the quantum well active layer 140, and recombine with holes in the well layer 141, thereby generating light. As in the MQW semiconductor laser shown in FIG. 11, a large optical gain is generated because of the quantum size effect. In addition, the light confinement is represented by the hatched portion of the electric field distribution and it can be significantly increased by optimum design of the refractive index distribution. Although the electric field distribution is broadened in the layer direction in the simple structure shown in FIG. 11 and it is quite difficult to improve the light confinement, in the laser structure of FIG. 12 it is possible to optimize the refractive index distribution and concentrate the electric field in the vicinity of the quantum well layer. As a result, the light confinement layer coefficient when the light confinement layer is introduced is about 3 to 5 times that when no light confinement layer is provided.

Examples of the calculated light confinement coefficient and electric field distribution in the MQW semiconductor laser of FIGS. 11 and 12 will be described with reference to FIG. 17(a). For the laser structure of FIG. 11, the light confinement coefficient of the well layer when the active layer 140 comprises three InGaAs well layers 8 nm (80 Å) thick and two InP barrier layers 10 nm (100 Å) thick laminated alternatingly, as shown in FIG. 17(a), is 0.5%. The electric field distribution has a peak in the active layer and a smooth configuration, as shown in FIG. 17(b). On the other hand, for the laser structure of FIG. 12, the light confinement coefficient when the active layer 140 comprises three InGaAs well layers 6 nm (60 Å) thick and two InGaAsP barrier layers 10 nm (100 Å) thick, having an energy band gap corresponding to a light wavelength of 1.31 μm, laminated alternatingly, and the light confinement layers 130 and 150 comprise InGaAsP having a composition with an energy band gap corresponding to a wavelength of 1.31 μm and a thickness of 68 nm (680 Å) is 1.8%. This light confinement coefficient is significantly improved relative to a structure without light confinement layers. In addition, the electric field distribution has a narrow peak in the active layer, as shown in FIG. 18(b).

The results show that the performance of the semiconductor laser having an active layer comprising an MQW structure is only insignificantly improved by introducing a multi-quantum well layer into the active layer and that a significant improvement was realized for the first time by inserting a light confinement layer.

In order to lower the threshold current of a semiconductor laser, it is necessary to confine the carriers to the active layer effectively. Particularly, in a quantum well semiconductor laser having an active layer with quite a small thickness, below about 10 nm (100 Å), the carriers injected into the active layer flow out to the cladding layer and are not effectively utilized. In order to lower the threshold current of a semiconductor laser by preventing such an overflow of carriers, the structure shown in FIG. 15 has been proposed. FIG. 15 is a cross-sectional view showing a conventional MQW semiconductor laser structure comprising InGaAsP series materials. In FIG. 14, reference numeral 201 designates an n type GaAs substrate. An n type $In_{0.5}(Ga_{0.3}Al_{0.7})_{0.5}P$ cladding layer 202 is disposed on the n type GaAs substrate 201. An $In_{0.5}(Ga_{0.5}Al_{0.5})_{0.5}P$ guide layer 203 is disposed on the p type cladding layer 202. An MQW active layer 204 comprising a plurality of InGaP well layers and a plurality of $In_{0.5}(Ga_{0.5}Al_{0.5})_{0.5}P$ barrier layer alternatingly laminated with each other is disposed on the guide layer 203. An $In_{0.5}(Ga_{0.5}Al_{0.7})_{0.5}P$ guide layer 205 is disposed on the MQW active layer 204. A multi-quantum barrier (MQB) structure 206 comprises InGaP layers and $In_{0.5}(Ga_{0.3}Al_{0.7})_{0.5}P$ layers alternatingly laminated with each other and an $In_{0.5}(Ga_{0.3}Al_{0.7})_{0.5}P$ upper cladding layer 207 is disposed on the MQB structure 206. A p type InGaAsP cap layer 208 is disposed on the p type upper cladding layer 207. Reference numeral 209 designates a current blocking layer, reference numeral 210 designates a p type GaAs layer, reference numeral 211 designates an n side electrode, and reference numeral 212 designates a p side electrode.

FIG. 16 is a diagram showing the energy band structure of the conduction band edge in the vicinity of the active layer of the semiconductor laser shown in FIG. 15. In FIG. 16, the same reference numerals designate the same or corresponding portions as shown in FIG. 15.

The MQB structure includes a laminated plurality of heterojunctions produced by mutually different composition semiconductor layers, each of which is several atomic layers thick. The first person to introduce an MQB structure into a semiconductor laser was Professor Iga of Tokyo Institute of Technology, and that structure was described, for example, in Japanese Published Patent Application 63-46788. This MQB structure includes a laminated plurality of GaInAsP thin films and a plurality of InP thin layers between bulk crystal active and cladding layers supplying the flow of carriers from the active layer to the cladding layer in high temperature operation of a semiconductor laser. Therefore, the temperature characteristic of the laser is improved.

On the other hand, in the quantum well semiconductor laser, the phenomenon of carrier overflow can be seen even in the normal temperature operation and the introduction of the MQB structure lowers the threshold current of the laser at normal temperature operation. In the prior art example of FIG. 15, six InGaAs layers, all 2 nm (20 Å) thick, and six $In_{0.5}(Ga_{0.3}Al_{0.7})_{0.5}P$ layers, respectively 50 nm (500 Å) thick, 6 nm (60 Å) thick, 3 nm (30 Å) thick, 3 nm (30 Å) thick, 3 nm (30 Å) thick, and 3 nm (30 Å) thick, from the side in contact with the guide layer 205 are alternatingly laminated. When such short period potential barriers exist, the electrons exhibit wave behavior and an interference effect also arises in an appropriately designed structure. Therefore, the electrons react to an energy barrier larger than the potential barrier of the actual material and are reflected. In other words, the electrons flowing out from the active layer are reflected by the MQB structure and are returned to the region of the guide layer. In the figure, the increment of the energy barrier reacted to is shown as ΔUe added to the band-discontinuity in the conduction band.

In this way, because the prior art quantum well semiconductor laser shown in FIG. 15 has a structure in which an MQB structure is provided between the guide layer (light confinement layer) and the cladding layer, the overflow of electrons from the active layer to the cladding layer is suppressed and the electrons are effectively confined to the active layer whereby the threshold current of the semiconductor laser is reduced.

As described above, the introduction of the light confinement layer is indispensable to a semiconductor laser having an active layer with a quantum well structure. However, because the light confinement layer is designed to have an intermediate composition between the well layer and the cladding layer of the quantum well active layer, the potential barrier to electrons injected into the well layer is restricted by the light confinement layer. Therefore, the electrons are likely to overflow to the barrier layer or light confinement layer of the quantum well active layer, causing the threshold current of the laser to increase and the dynamic characteristics of the laser to deteriorate significantly. This is actually pointed out by W. Rideout et al, *IEEE Photon Technology Letters*, Volume 3, pages 784–786, 1991.

In the prior art quantum well semiconductor laser shown in FIG. 15, the overflow of electrons into the cladding layer is suppressed but no consideration is given to preventing the overflow of electrons into the barrier layer and the light confinement layer of the quantum well active layer and there also arise the above-described problems in this prior art device.

SUMMARY OF THE INVENTION

It is an object of the present invention to provide a quantum well semiconductor laser that maintains significant light confinement and suppresses electron overflow into the barrier layer and light confinement layer.

Other objects and advantages of the present invention will become apparent from the detailed description given hereinafter. It should be understood, however, that the detailed description and specific embodiments are given by way of illustration only since various changes and modifications within the scope of the invention will become apparent to those skilled in the art from this detailed description.

According to a first aspect of the present invention, light confining layers having an MQB structure comprising a plurality of semiconductor layers having mutually different compositions laminated alternatingly with each other are provided, and the compositions, thicknesses, and numbers of the light confinement layers are adjusted so that those layers produce an energy barrier larger than the energy barrier inherent to the material against carriers that are injected into the active layer, the refractive index distribution in the vicinity of the active layer concentrates the electric field in the active layer, and the quantum barrier layers are in contact with the quantum well structure active layer.

Therefore, the light confinement in the active layer is increased and the overflow of carriers into the light confinement layer is suppressed whereby the threshold current of the MQW semiconductor laser is reduced and the external quantum efficiency is enhanced.

According to a second aspect of the present invention, as a barrier layer in a semiconductor laser having an MQW active layer, there is provided an MQB structure that produces an energy barrier larger than the energy barrier inherent to the material against the carriers injected into the well layer of the MQW structure. Therefore, the overflow of carriers into the barrier layer is suppressed and the threshold current of the MQW semiconductor laser is reduced, the external quantum efficiency is increased, and the dynamic characteristics are enhanced.

BRIEF DESCRIPTION OF THE DRAWINGS

FIGS. 5(a)–5(c) are diagrams for explaining the operation of an MQW semiconductor laser according to a second embodiment of the present invention.

DETAILED DESCRIPTION OF THE PREFERRED EMBODIMENTS

Embodiment 1

Figure 1:
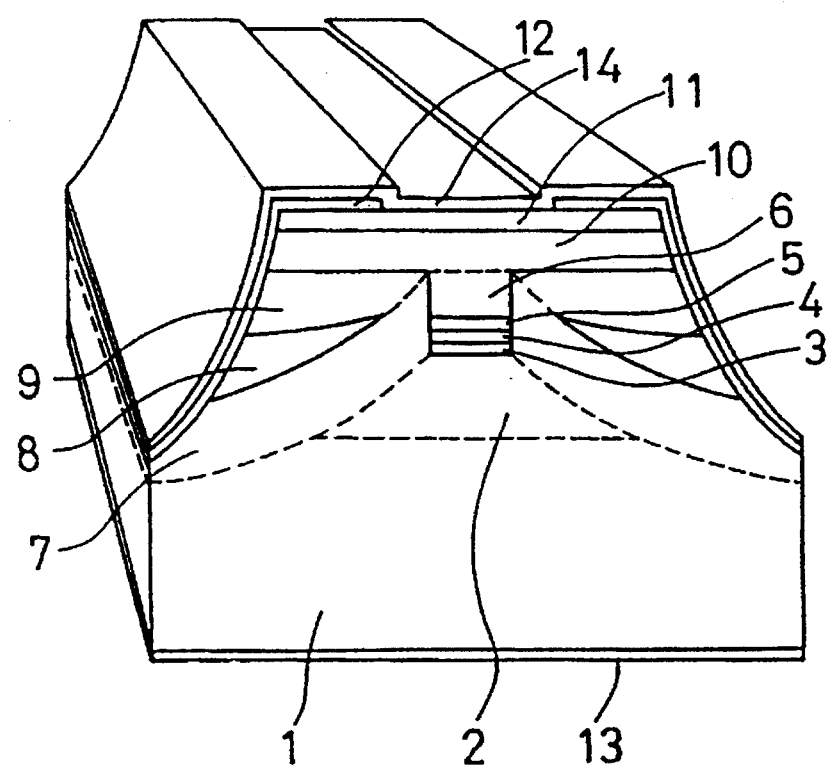
FIG. 1 is a perspective view showing a structure of a MQW semiconductor laser according to a first embodiment of the present invention.

FIG. 1 is a perspective view illustrating a quantum well semiconductor laser according to a first embodiment of the present invention. In the figure, reference numeral 1 designates a p type InP substrate. A p type lower InP cladding layer 2 is disposed on the InP substrate 1. A p type light confinement layer 3 is disposed on the lower cladding layer 2, a quantum well active layer 4 is disposed on the p type light confinement layer 3, and an n type InP first upper cladding layer 6 is disposed on the n type light confinement layer 5. A semiconductor laminated layer structure comprising the lower cladding layer 2 to the first upper cladding layer 6 is formed in a mesa stripe configuration by mesa etching reaching the substrate 1. In addition, a p type InP first burying layer 7, an n type InP second burying layer 8, and a p type InP third burying layer 9 are successively disposed to bury the mesa stripe. An n type InP second upper cladding layer 10 is disposed on the mesa stripe and on the p type InP third burying layer 9, and an n type InGaAsP contact layer 11 is disposed on the second upper cladding layer 10. Reference numeral 12 designates an insulating film. An n side electrode 14 is provided on the insulating film 12 and contacts the contact layer 11 in a stripe aperture in the insulating film 12. A p side electrode 13 is provided on the rear surface of the substrate 1.

Figure 2:
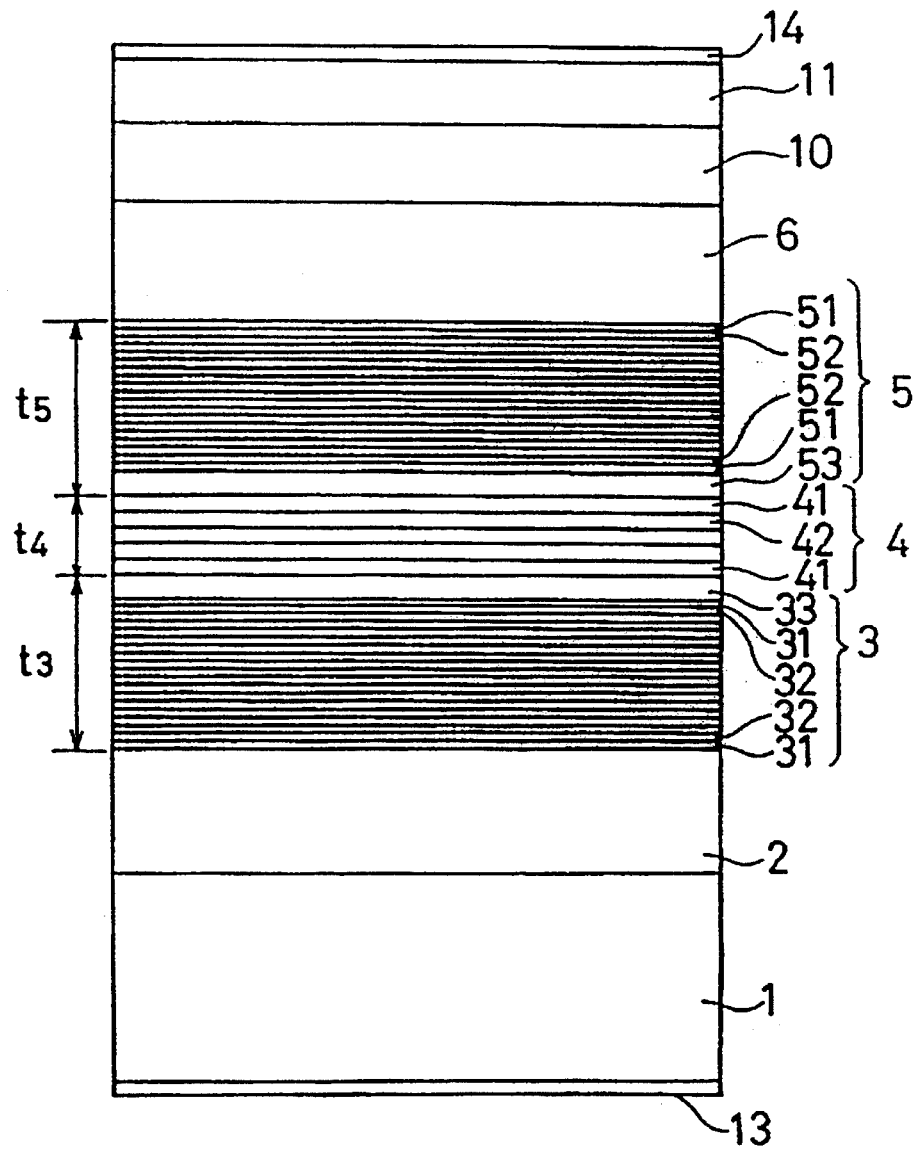
FIG. 2 is a cross-sectional view schematically showing a main portion of the semiconductor laser of FIG. 1.

FIG. 2 is a cross-sectional view schematically illustrating a main portion of the quantum well semiconductor laser shown in FIG. 1. In the figure, the same reference numerals used in FIG. 1 are used to designate the same or corresponding elements.

The quantum well active layer 4 comprises a multi-quantum well (hereinafter referred to as an MQW) structure that includes three InGaAs well layers 41 and two InP barrier layers 42. The thickness of each well layer 41 is, for example, 5 nm (50 Å), the thickness of each barrier layer 42 is, for example, 10 nm (100 Å), and the total thickness t4 of the quantum well active layer 4 is 35 nm (350 Å).

The p type MQB light confinement layer 3 comprises a first barrier layer 33, i.e., a tunneling preventing layer, comprising InP disposed in contact with the quantum well active layer 4 and a superlattice structure including ten InGaAs well layers 31 and nine InP barrier layers 32 alternating with each other. The tunneling preventing layer 33 is relatively thick, 20 nm (200 Å), to prevent the tunneling of electrons into the superlattice structure. In the superlattice structure, each InGaAs well layer 31 is seven atomic layers thick where one atomic layer thickness is 0.3 nm (3 Å), i.e., the total thickness is 2.1 nm (21 Å), and each InP barrier layer 32 is nine atomic layers thick, i.e., the total thickness is 2.7 nm (27 Å). Thus, the total thickness t3 of the light confinement layer 3 is 65.3 nm (653 Å).

The n type MQB light confinement layer 5 comprises an InP tunneling preventing layer 53 and a superlattice structure including ten InGaAs well layers 51 and nine InP barrier layers 52 alternating with each other. The thicknesses of the tunneling preventing layer 53, the well layer 51, and the barrier layer 52 are respectively the same as the thicknesses of the tunneling preventing layer 33, the well layer 31, and the barrier layer 32 of the p type light confinement layer 3, and the total layer thickness t5 of the n type MQB light confinement layer 5 is 65.3 nm (653 Å).

Figure 3A:
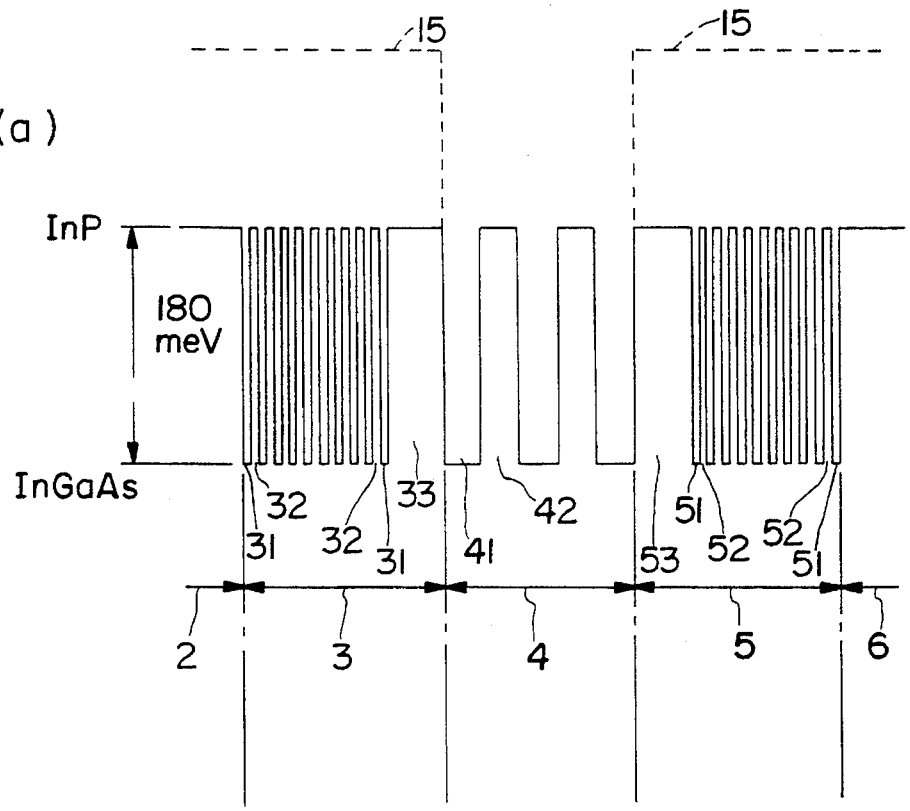
FIGS. 3(a)–3(c) are diagrams for explaining the operation of the semiconductor laser of FIG. 1.
Figure 3B:
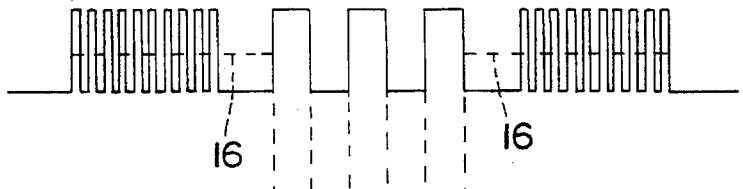
Figure 3C:
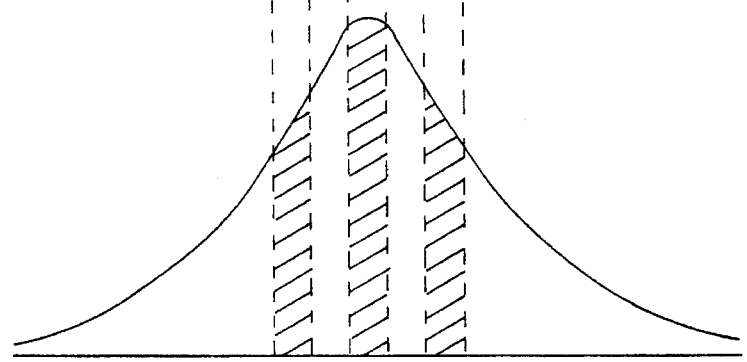

FIGS. 3(a)–3(c) are diagrams explaining the operation of the quantum well semiconductor laser shown in FIG. 1 where FIG. 3(a) is an energy band diagram showing the conduction band edge in the vicinity of the active layer, FIG. 3(b) is a diagram showing the refractive index distribution corresponding to FIG. 3(a), and FIG. 3(c) is a diagram showing the electric field distribution corresponding to FIG. 3(a). In the figures, the same reference numerals used in FIGS. 1 or 2 are used to designate the same or corresponding elements.

In the operation of the laser, electrons injected from the cladding layer 6 recombine in the well layer 41 of the MQW active layer, thereby generating a tremendously large optical gain. Here, electrons having a relatively high energy in the well layer 41 overflow from the well layer 41 and are intended to diffuse into the light confinement layer.

In this first embodiment, the light confinement layer is an MQB structure as described above and, therefore, the electrons that overflow to the light confinement layer can be significantly reduced; that is, when the above-described potential barriers having a short period are present, the electrons exhibit wave behavior and, as a result of an appropriate design, an interference effect occurs and the electrons respond to an energy barrier 15 larger than the potential barrier that the material inherently possesses and are reflected and again captured by the quantum well.

The increased potential barrier due to the MQB structure used in this embodiment will be described with reference to calculated results.

Figure 4:
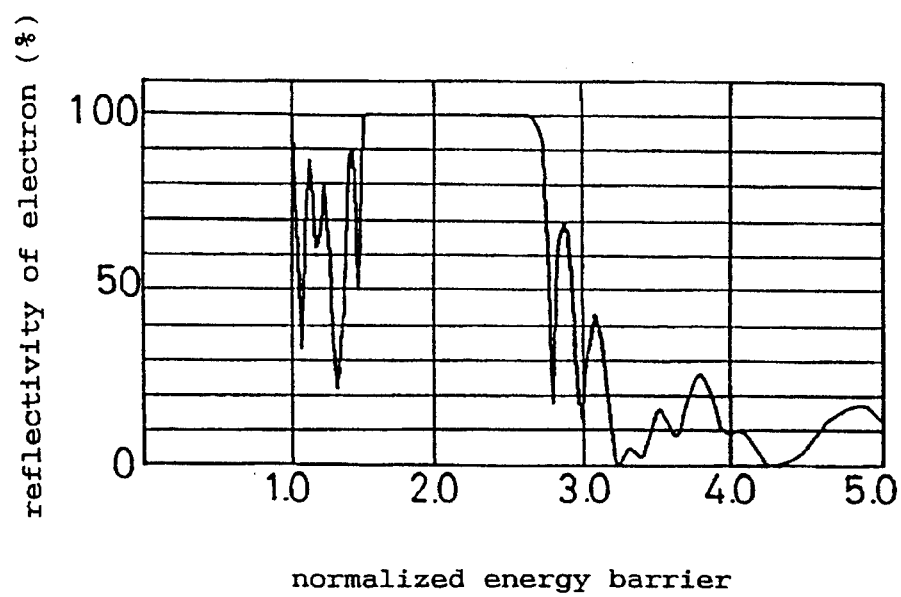
FIG. 4 is a diagram showing electron reflectivity of the MQB structure used in the semiconductor laser of FIG. 1.

FIG. 4 is a diagram showing the calculated value of the electron energy barrier in the MQB structure of this embodiment where the ordinate is the energy of an electron normalized to the value of the real energy barrier (inherent to the material) between InP and InGaAs and the abscissa is the electron reflectivity of the MQB. The real energy barrier between InP and InGaAs is about 180 meV when ΔEc =0.3, and the value 1.0 on the ordinate corresponds to 180 meV. According to the calculated results, the energy barrier due to the MQB is increased to about 2.8 times the energy barrier inherent in the material, although there exist electrons that transit a particular energy barrier. This barrier has a significant energy height in the Fermi-Dirac distribution of electrons at room temperature. Accordingly, the overflow of carriers injected from the quantum well active layer 4 into the light confinement layer 3 or 5 is greatly suppressed relative to when a single InGaAsP light confinement layer is employed. In the above-described calculation, the effective mass ratio of electrons is 0.041 in the well layer and 0.077 in the barrier layer.

On the other hand, because the periods of the InP barrier layers and InGaAs well layers of the light confinement layer having the MQB structure are quite short, the light generated in the active layer behaves as if the refractive index of the MQB light confinement layer is intermediate those of the InP barrier layer and the InGaAs well layer. In other words, the light confinement layer of this structure functions similar to a light confinement layer comprising InGaAsP for light generated in the active layer and concentrates the electric field in the active layer.

Figure 19A:
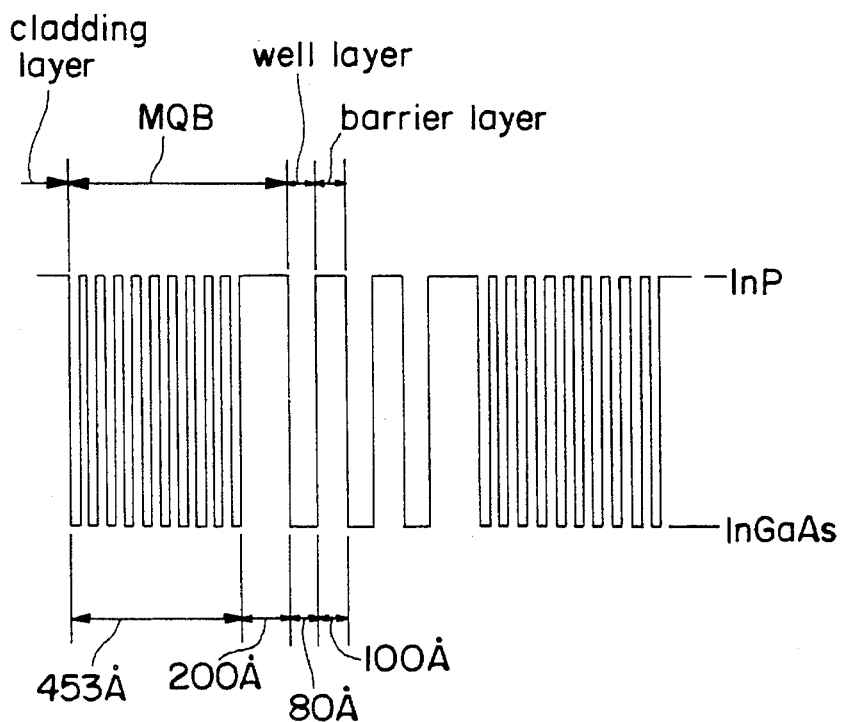
FIGS. 19(a) and 19(b) are diagrams for explaining calculated examples of light confinement in a semiconductor laser according to the first embodiment of the present invention.
Figure 19B:
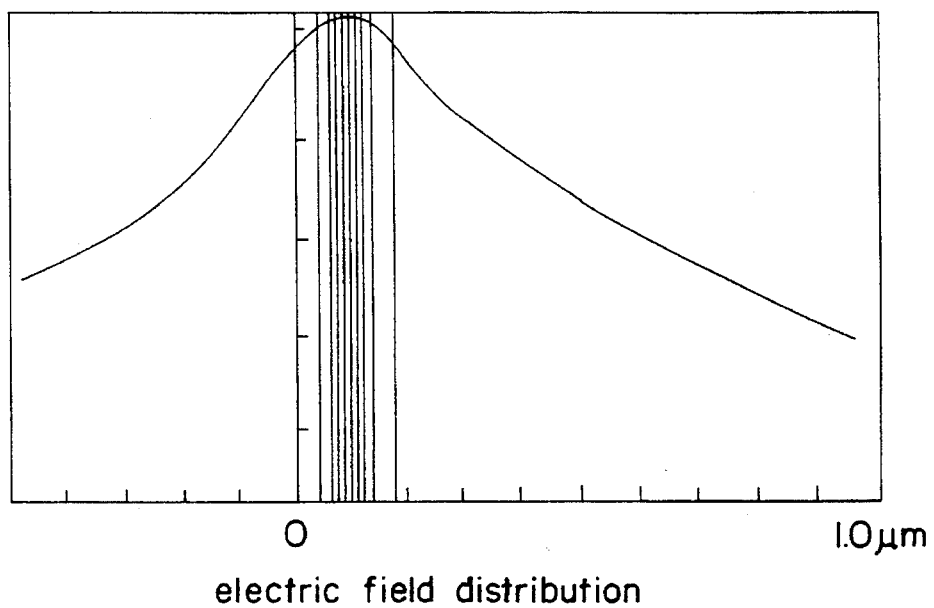

Calculated examples of the light confinement coefficient and the electric field distribution in the quantum well semiconductor laser of this first embodiment will be described below. In FIG. 2, the light confinement coefficient in the well layer when the active layer 4 is three InGaAs well layers 8 nm (80 Å) thick and two InP barrier layers 10 nm (100 Å) thick, arranged alternatingly, and the MQB light confinement layers 3 and 5 each comprise an InP tunneling preventing layer 20 nm (200 Å) thick in contact with the active layer 4 and a superlattice structure of ten InGaAs well layers 2.1 nm (21 Å) thick and nine InP barrier layers 2.7 nm (27 Å) thick, arranged alternatingly, is 1.4%, showing a large improvement relative to no light confinement layer. In addition, the electric field distribution then has a steep configuration where the degree of concentration in the active layer is large, as shown in FIG. 19(b).

As described above, in this first embodiment, in a quantum well semiconductor laser, light confinement layers having an MQB structure are disposed adjacent the quantum well active layer and the compositions, thicknesses, and number of layers of the MQB structure are designed so that an energy barrier higher than the energy barrier inherent in the material is produced for the carriers injected into the active layer and the refractive index distribution in the vicinity of the active layer concentrates the electric field in the active layer. Therefore, the light confinement in the active layer is increased by the optimization of the refractive index distribution through the introduction of the light confinement layers and overflow of carriers injected into the quantum well active layer is suppressed by the increased energy barrier produced by the MQB structure. Thereby, the threshold current of the quantum well semiconductor laser is reduced, the external quantum efficiency is increased, and the dynamic characteristics are improved.

Embodiment 2

FIGS. 5(a)–5(c) are diagrams for explaining a quantum well semiconductor laser according to a second embodiment of the present invention where FIG. 5(a) is an energy band diagram of the conduction band edge in the vicinity of the active layer of the quantum well semiconductor laser according to the second embodiment of the present invention, FIG. 5(b) is a diagram showing a refractive index distribution corresponding to FIG. 5(a), and FIG. 5(c) is a diagram showing electric field distribution corresponding to FIG. 5(a).

In the figures, the same reference numerals used in the FIGS. 1 and 2 are used to designate the same or corresponding element. Reference numeral 35 designates a p type InGaAsP barrier layer, numeral 36 designates a p type InGaAsP tunneling preventing layer, numeral 45 designates an InGaAsP barrier layer, numeral 55 designates an n type InGaAsP barrier layer, and numeral 56 designates an n type InGaAsP tunneling preventing layer. Also, in this second embodiment, as in the first embodiment, the effect of increasing the energy barrier due to the MQB structure makes the effective energy barrier of the light confinement layer to carriers injected into the quantum well active layer 4, the energy barrier 15, higher than the energy barrier inherent between InGaAsP and InGaAs, as shown in FIG. 5(a). The overflow of carriers injected into the quantum well active layer 4 to the light confinement layers 3 and 5 is largely suppressed compared to use of a single layer InGaAsP light confinement layer. Accordingly, as in the first embodiment, the threshold current of the quantum well semiconductor laser is reduced, the external quantum efficiency is improved, and, further, the dynamic characteristics are enhanced.

Figure 20A:
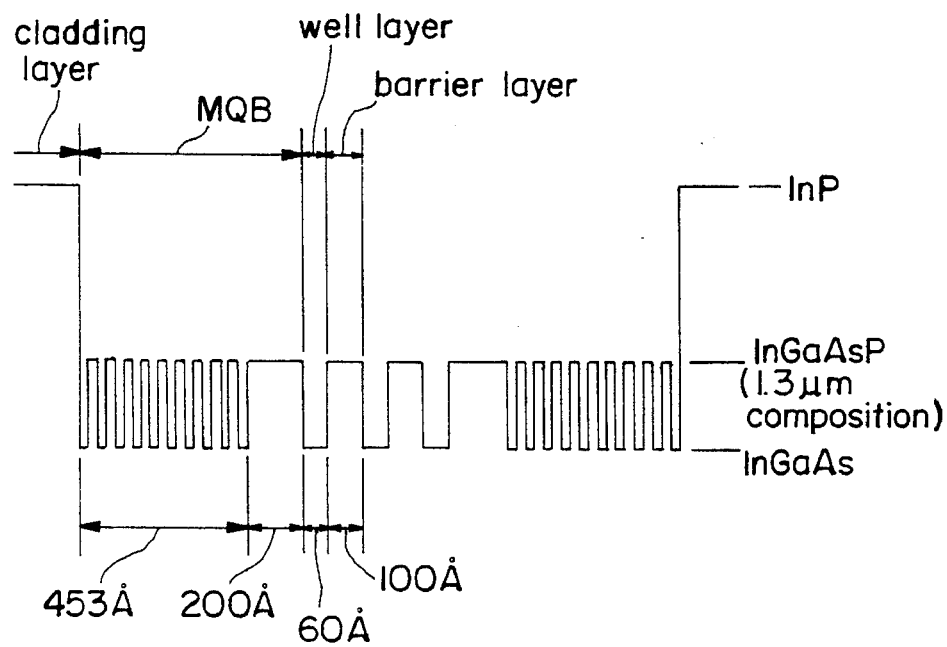
FIGS. 20(a) and 20(b) are diagrams for explaining calculated examples of light confinement in a semiconductor laser according to the second embodiment of the present invention.
Figure 20B:
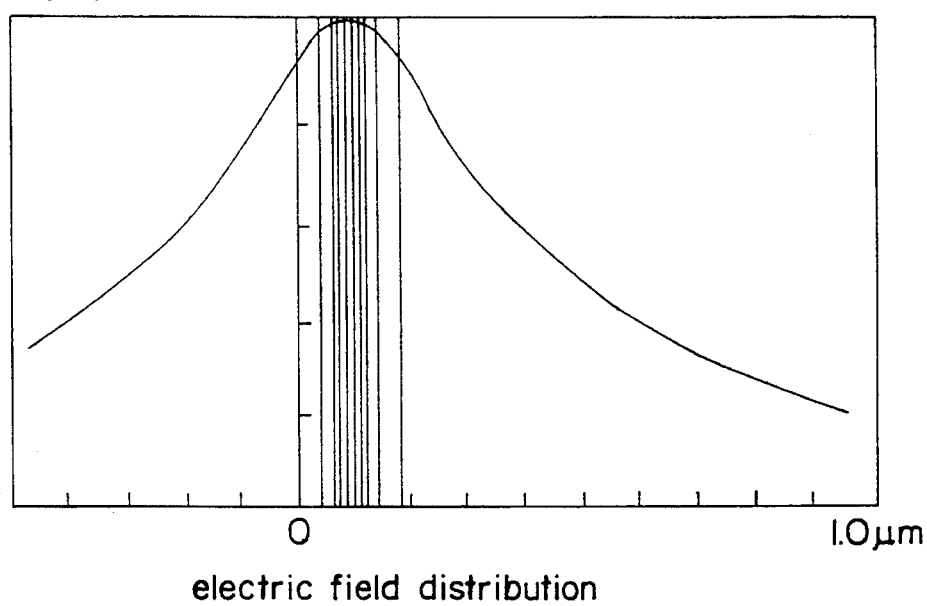

Calculated examples of the light confinement coefficient and the electric field distribution in the quantum well semiconductor laser of this embodiment will be described below. The light confinement coefficient in the well layer when the active layer 4 is a structure including three InGaAs well layers 6 nm (60 Å) thick and two InGaAsP (having a constituent ratio producing an energy band gap corresponding to a wavelength of 1.3 μm) barrier layers 10 nm (100 Å) thick, arranged alternatingly, and the MQB light confinement layers 3 and 5 comprise an InGaAsP (having a constituent ratio producing an energy band gap corresponding to a wavelength of 1.3 μm) tunneling preventing layer 20 nm (200 Å) thick in contact with the active layer 4 and a superlattice structure including ten InGaAs well layers 2.1 nm (21 Å) thick and nine InGaAsP barrier layers 2.7 nm (27 Å) thick is 1.9%, a large increase relative to use of no light confinement layer. In addition, the electric field distribution then has a steep configuration and the degree of concentration in the active layer is large, as shown in FIG. 20(b).

While in the above-described first and second embodiments both the p type light confinement layer and the n type light confinement layer have an MQB structure, the overflow of the carriers from the active layer is particularly significant for electrons and, therefore, only the p type light confinement layer needs to be an MQB structure.

While in the above-described first and second embodiments the light confinement layers disposed above and below the active layer are doped p type and n type, respectively, they may be undoped semiconductor layers.

Embodiment 3

Figure 6:
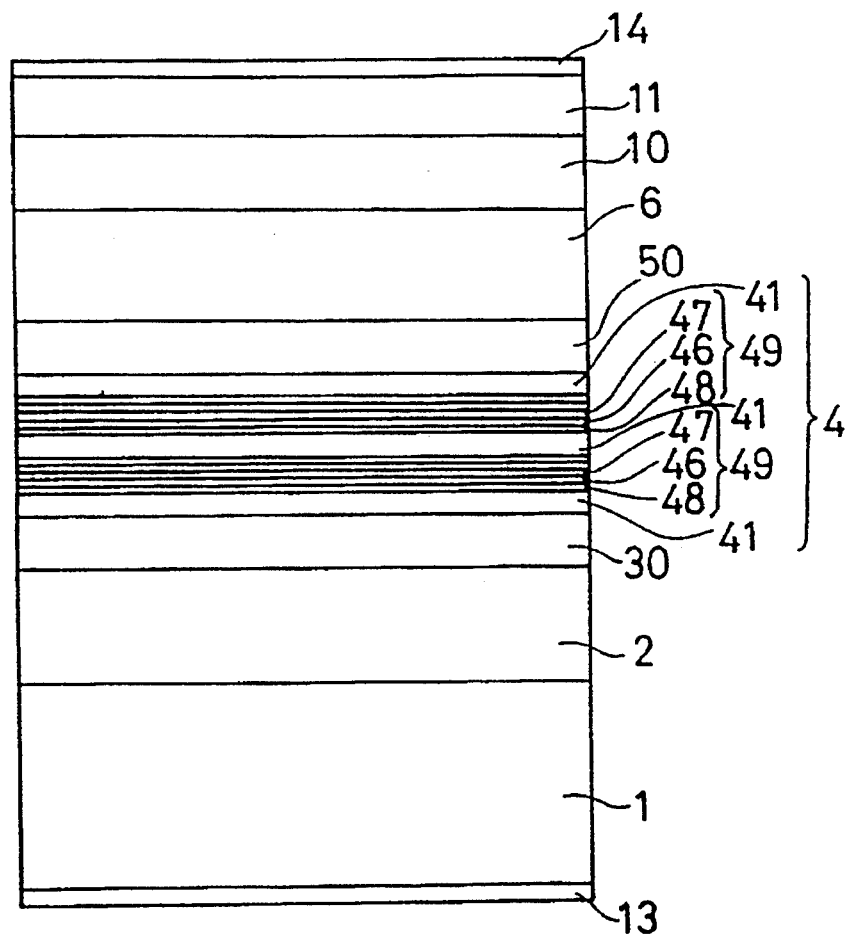
FIG. 6 is a cross-sectional view schematically illustrating a main portion of an MQW semiconductor laser according to a third embodiment of the present invention.

FIG. 6 is a cross-sectional view schematically showing a quantum well semiconductor laser according to a third embodiment of the present invention. In the figure, the same reference numerals used in FIG. 2 are used to designate the same or corresponding elements. The third embodiment of the present invention employs a barrier layer and the quantum well active layer 4, an MQW structure. The MQB layer 49 includes an InP tunneling preventing layer 48 in contact with the well layer 41 of the quantum well active layer 4 and a structure of alternatingly laminated InGaAs well layers 46 and InP barrier layers 47. Reference numeral 30 designates a p type InGaAsP light confinement layer and numeral 50 designates an n type InGaAsP light confinement layer.

Figure 7:
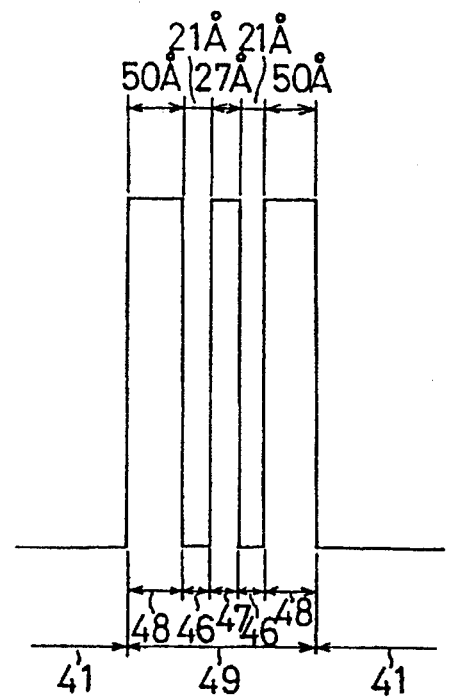
FIG. 7 is an energy band diagram showing the conduction band edge in the vicinity of the barrier layer of the semiconductor laser of FIG. 6.

FIG. 7 is an energy band diagram illustrating the conduction band edge in the vicinity of the MQB layer 6 where the same reference numerals as those in FIG. 6 are used to designate the same or corresponding elements.

The barrier layer in the MQB structure is required to be thick so that overlapping of the wave functions in the adjacent well regions is small. However, when the barrier layer is too thick, the entire thickness of the active layer becomes too large and control of the transverse mode of the laser light deteriorates. Accordingly, the barrier layer is usually 15 to 20 nm (150 to 300 Å) thick. In this embodiment, tunneling preventing layers 48 5 nm (50 Å) thick are provided at both sides and two well layers 46 2.1 nm (21 Å) thick and a barrier layer 47 2.7 nm (27 Å) thick are inserted therebetween. The entire thickness of the barrier layer 49 is 16.9 nm (169 Å).

Figure 8:
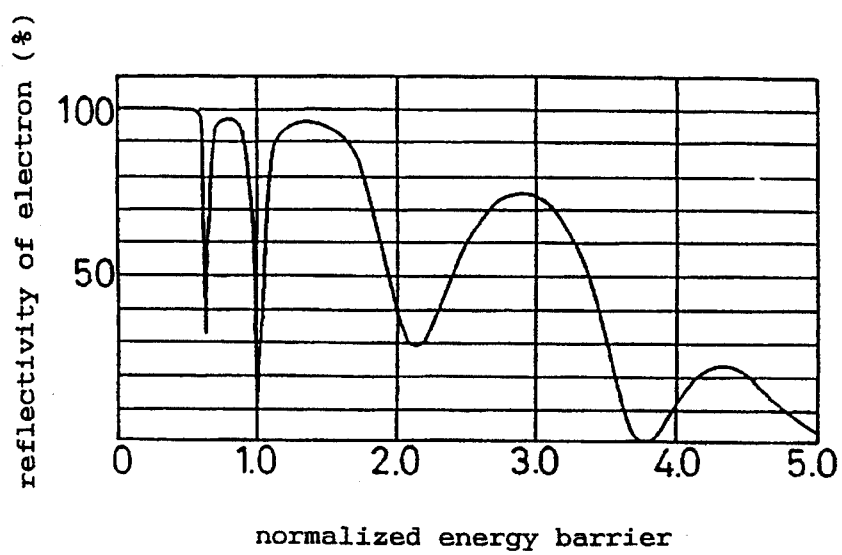
FIG. 8 is a diagram showing the electron reflectivity of the MQB structure of the semiconductor laser of FIG. 6.

FIG. 8 is a diagram showing a calculated example of the energy barrier for electrons in an MQB having the structure shown in FIG. 7 where the ordinate is the normalized value of the rear energy barrier between InP and InGaAsP and the abscissa is electron reflectivity. The value of 1.0 on the ordinate corresponds to 180 meV. As shown in the figure, in the MQB structure of FIG. 7, although transmission actually occurs at a particular energy, a reflectivity larger than 70% is obtained, an effect of about 1.8 times the real energy barrier.

The electrons injected into the well layer 41 recombine and generate a tremendously large optical gain. Here, the electrons having a relatively high energy in the well layer 41 overflow and are intended to diffuse to the barrier layer of the quantum well active layer, but these electrons are reflected by the increased energy barrier of the MQW structure and are again captured by the quantum well. As a result, this embodiment significantly reduces the overflow of electrons injected into the well layer 41.

As described above, in this third embodiment, an MQB structure barrier layer 49 comprising a plurality of mutually different composition semiconductor layers laminated with each other and producing an energy barrier higher than the energy barrier inherent to the material for the carriers injected into the well layer of a multi-quantum well structure is provided and, therefore, the overflow of carriers into the barrier layer is suppressed and the threshold current of the quantum well semiconductor laser is reduced, external quantum efficiency is increased, and dynamic characteristics are improved.

Embodiment 4

Figure 9:
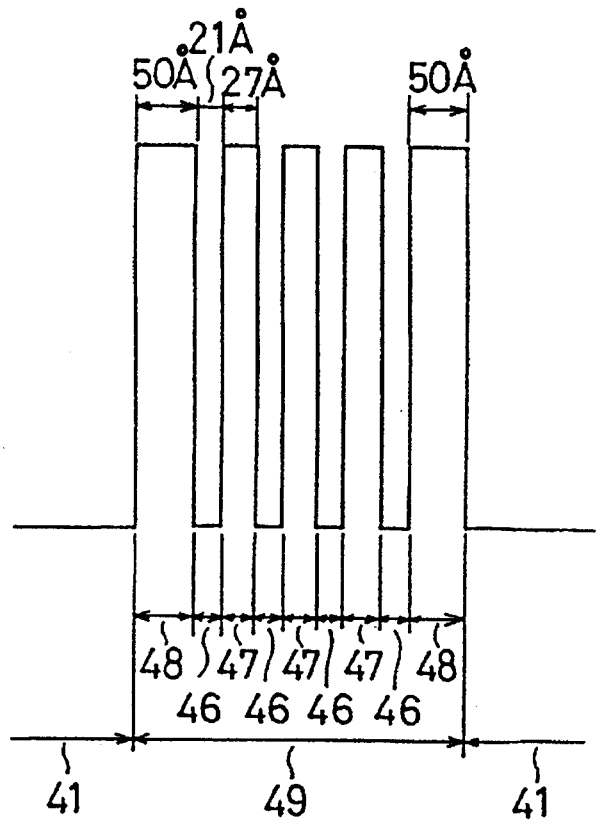
FIG. 9 is an energy band diagram showing the conduction band edge of the barrier layer of an MQW semiconductor laser according to a fourth embodiment of the present invention.

FIG. 9 is an energy band diagram showing the conduction band edge in the vicinity of a the barrier layer of the MQW active layer of a quantum well semiconductor laser according to a fourth embodiment of the present invention. In FIG. 9, the same reference numerals are used to designate the same or corresponding elements as used in FIG. 7. The structure, other than the barrier layer 49, of the fourth embodiment is the same as the third embodiment.

Figure 10:
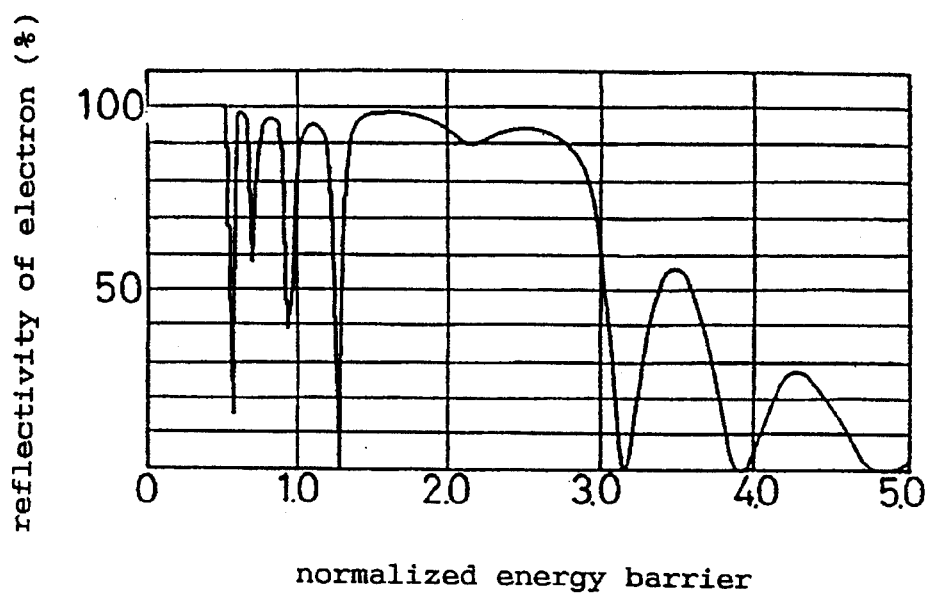
FIG. 10 is a diagram showing electron reflectivity of the MQB structure of the semiconductor laser according to the fourth embodiment of the present invention.
Figure 11:
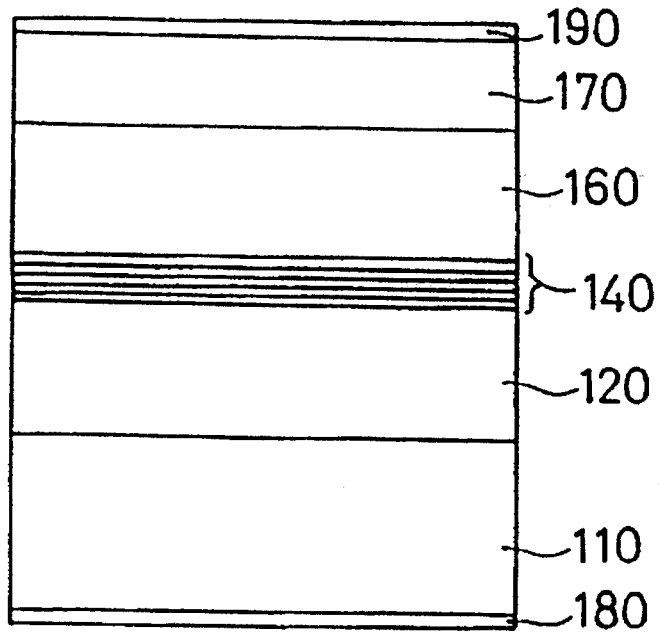
FIG. 11 is a cross-sectional view showing a structure of a main portion of an MQW semiconductor laser at the beginning of its development.
Figure 12:
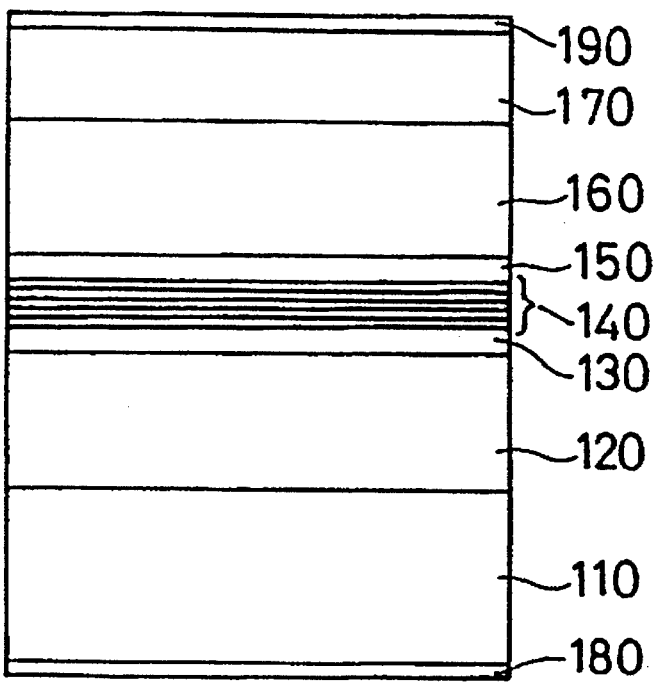
FIG. 12 is a cross-sectional view showing the structure of a main portion of an MQW semiconductor laser provided with a light confinement layer.
Figures 13A, 13B, 13C:
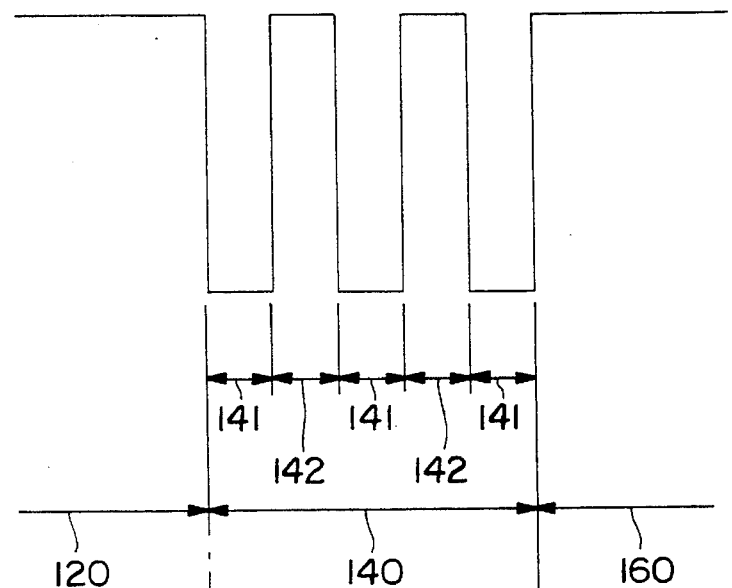
FIGS. 13(a)–13(c) are diagrams for explaining the operation of the semiconductor laser shown in FIG. 11.
Figure 14A:
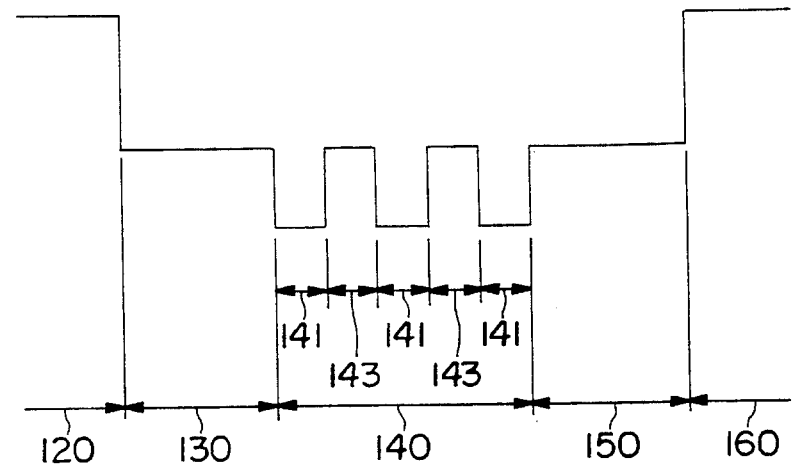
FIGS. 14(a)–14(c) are diagrams for explaining the operation of the semiconductor laser shown in FIG. 12.
Figure 14B:
Figure 14C:
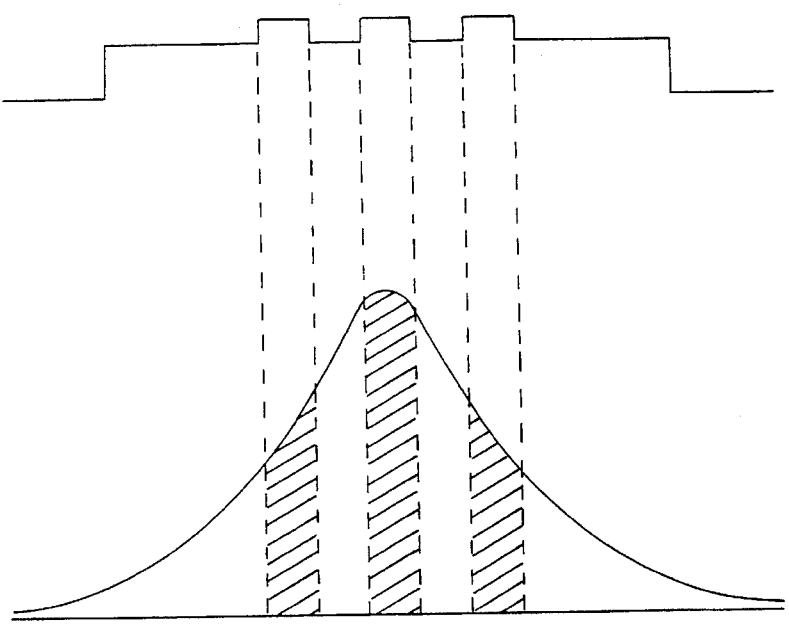
Figure 15:
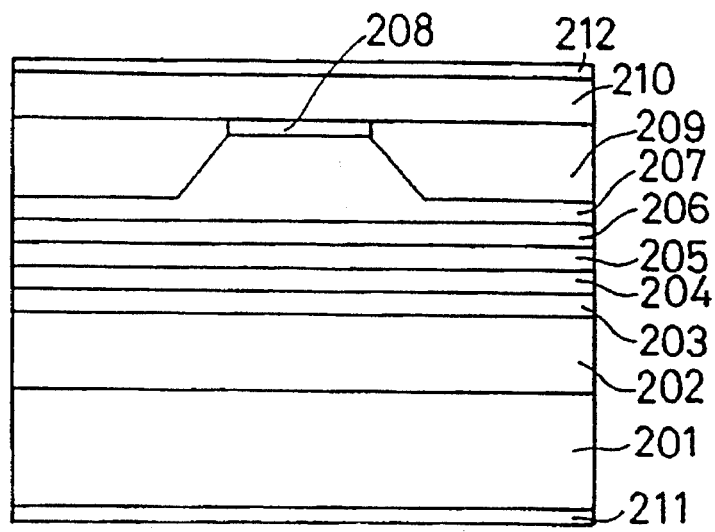
FIG. 15 is a cross-sectional view showing a structure of a conventional MQW semiconductor laser provided with an MQB structure.
Figure 16:
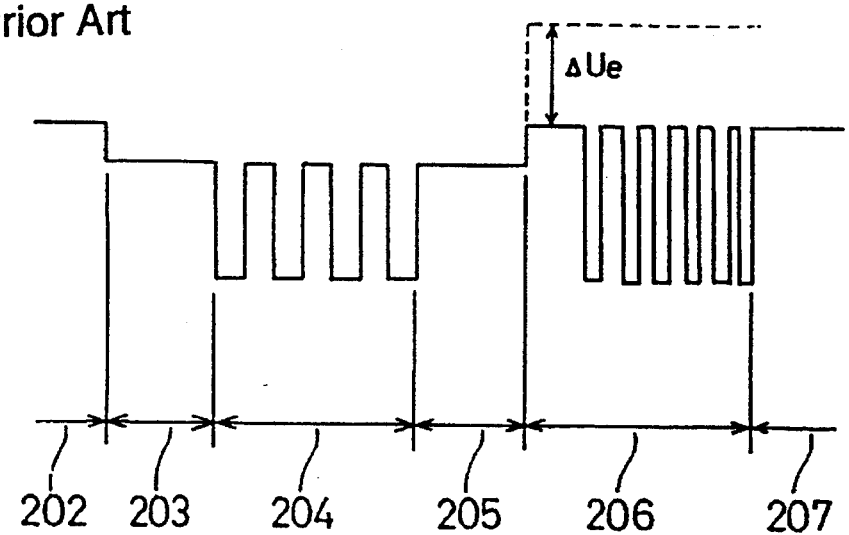
FIG. 16 is an energy band diagram showing the conduction band edge in the vicinity of the active layer of the semiconductor laser shown in FIG. 15.
Figure 17A:
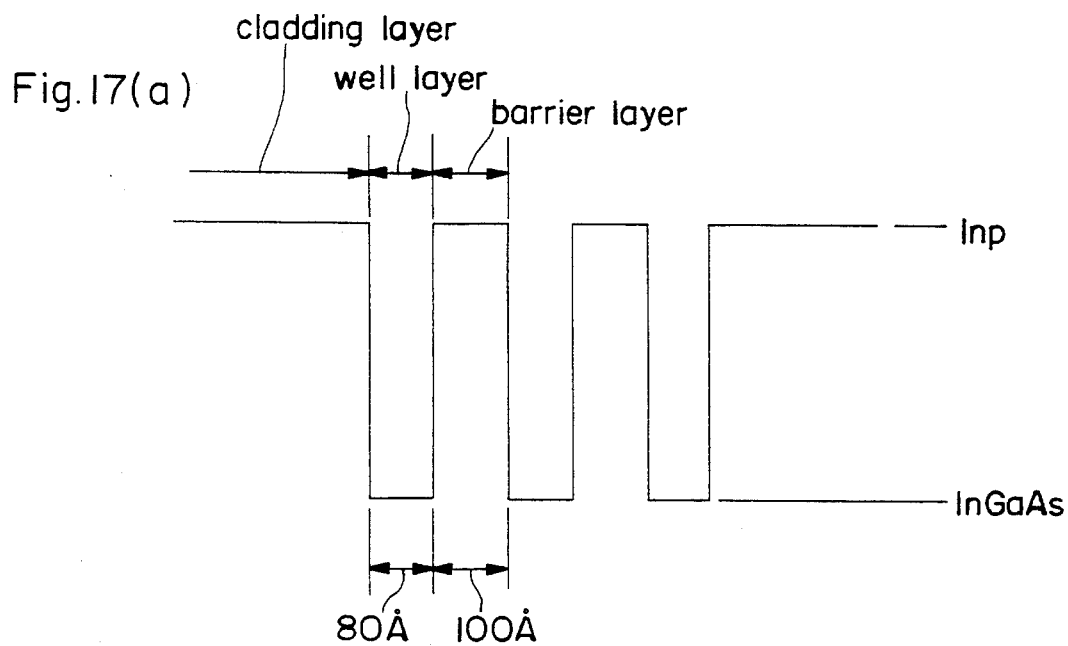
FIGS. 17(a) and 17(b) are diagrams for explaining calculated examples of light confinement in the semiconductor laser shown in FIG. 11.
Figure 17B:
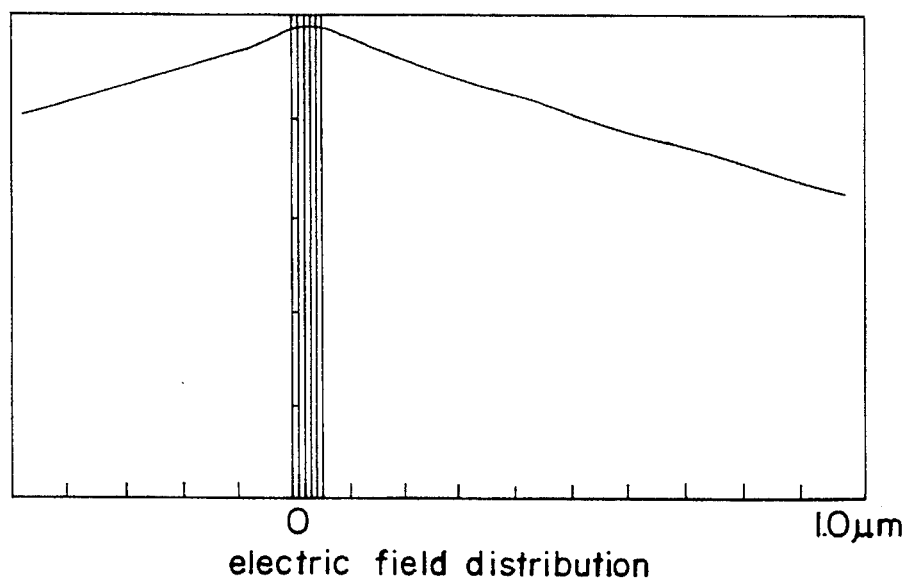
Figure 18A:
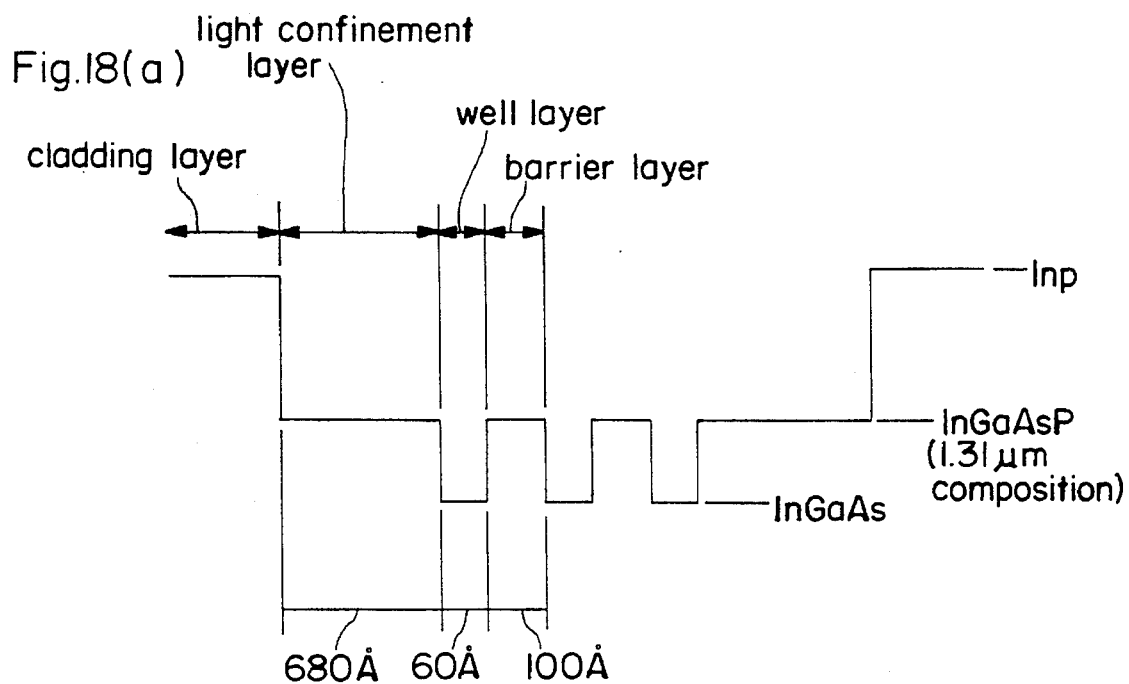
FIGS. 18(a) and 18(b) are diagrams for explaining calculated examples of light confinement in the semiconductor laser shown in FIG. 12.
Figure 18B:
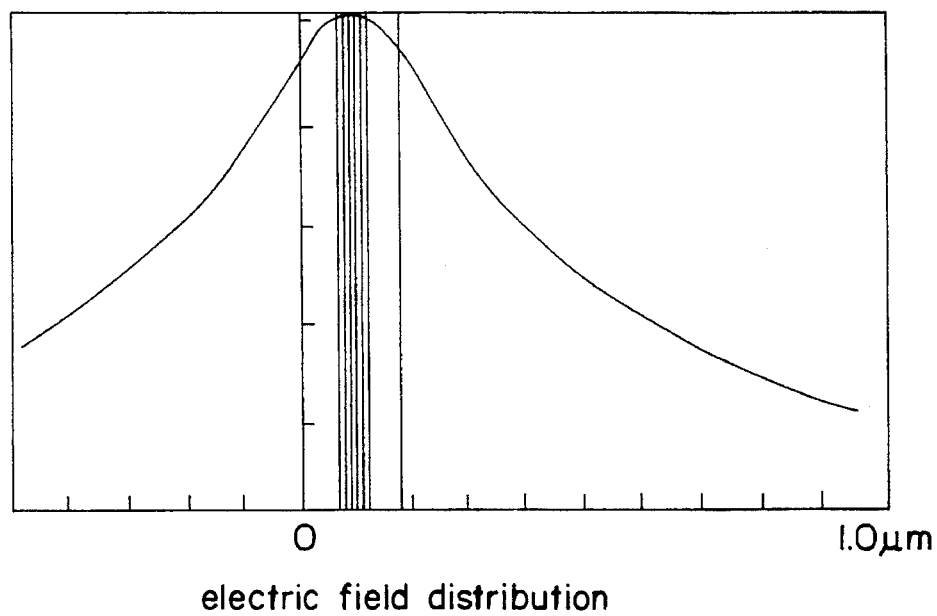

In the above-described third embodiment, two InGaAs well layers 46 are provided for the MQB 22 layer 49, but in the this fourth embodiment, four InGaAs well layers 46 are provided. In other words, electron tunneling preventing layers 48 5 nm (50 Å) thick are provided at both sides and four well layers 46 2.1 nm (21 Å) thick and three barrier layers 47 2.7 nm (27 Å) thick are alternatingly laminated with each other. The entire layer thickness of the of the barrier layer 49 is 26.5 nm (265 Å). FIG. 10 is a diagram showing calculated examples of the electron energy barrier in an MQB having the structure shown in FIG. 9 and the ordinate is the normalized electron energy relative to the actual energy barrier between InP and InGaAs and the abscissa is the electron reflectivity of the MQB. The value of 1.0 on the ordinate corresponds to 180 meV. As shown in the figure, in the MQW structure of FIG. 9, although transmission occurs at a particular energy, a reflectivity of about 70% or more, about three times that of the real energy barrier, is achieved. Accordingly, in this embodiment, the overflow of the electrons injected to the well layer 41 from the barrier layer 49 is significantly reduced relative to the third embodiment.

While in the above-described third and fourth embodiments the light confinement layer comprises a single InGaAsP layer, by introducing the MQB structure shown in the first and second embodiments as a light confinement layer, both the overflow of electrons to the barrier layer and the overflow of electrons into the light confinement layer are effectively suppressed and a further large reduction of the threshold voltage and enhancement of the dynamic characteristics of a quantum well semiconductor laser device are achieved.

The whole structure of the quantum well semiconductor laser and its current confinement structure are not limited to a PPIBH (p-substrate partially inverted buried heterostructure) and other structures that can be applied to a quantum well semiconductor laser, for example, a ridge waveguide structure, may be employed.

While in the above-illustrated embodiments, a p type substrate is employed, the present invention may be applied to an n type substrate upon inverting the conductivity types of respective layers.

While in the above embodiments, lasers producing 1.2 to 1.6 μm wavelength light employing an InP substrate and InGaAsP series materials for the active layer are employed, the present invention can be applied to a laser producing 0.66 to 0.69 μm wavelength light employing a GaAs substrate and InGaAsP series materials for the active layer with the same effects as described above.

As is evident from the foregoing description, according to a first embodiment of the present invention, in a quantum well semiconductor laser, a light confinement layer with an MQB structure is provided whereby light confinement in the active layer is increased and overflow of carriers to the light confinement layer is suppressed, the threshold current of the quantum well semiconductor laser is reduced, external quantum efficiency is increased, and dynamic characteristics are enhanced.

Further, according to a second embodiment of the present invention, in a quantum well semiconductor laser, an MQB structure is provided whereby overflow of carriers to the light confinement layer is suppressed, the threshold current of the quantum well semiconductor laser is reduced, external quantum efficiency is increased, and dynamic characteristics are enhanced.

What is claimed is:

1. In a quantum well semiconductor laser, a structure comprising a semiconductor multi-quantum well active layer in which laser light is produced, the multi-quantum well active layer comprising three InGaAs layers, each InGaAs layer having a thickness of 8 nm, and two InP layers, each InP layer having a thickness of 10 nm, laminated alternatingly with each other; and a multiple quantum barrier light confinement structure comprising a superlattice structure and a tunneling preventing layer disposed between the superlattice structure and the active layer, the superlattice structure comprising a plurality of well layers, each well layer comprising a first semiconductor having an energy band gap, and a plurality of barrier layers, each barrier layer comprising a second semiconductor having a larger energy band gap than the first semiconductor, the well layers and barrier layers being alternatingly laminated with each other, the tunneling preventing layer preventing charge carriers in the active layer from tunneling into the superlattice structure, the light confinement structure producing an energy barrier higher than an energy barrier inherent to the well layers and the barrier layers for charge carriers injected into the active layer and producing a refractive index distribution that concentrates an electric field in the active layer, the light confinement structure being disposed in contact with the active layer.

2. In a quantum well semiconductor laser, a structure comprising a semiconductor multi-quantum well active layer in which laser light is produced, the multi-quantum well active layer comprising three InGaAs layers, each InGaAs layer having a thickness of 8 nm, and two InGaAsP layers, each InGaAsP layer having a thickness of 10 nm, laminated alternatingly with each other; and a multiple quantum barrier light confinement structure comprising a superlattice structure and a tunneling preventing layer disposed between the superlattice structure and the active layer, the superlattice structure comprising a plurality of well layers, each well layer comprising a first semiconductor having an energy band gap, and a plurality of barrier layers, each barrier layer comprising a second semiconductor having a larger energy band gap than the first semiconductor, the well layers and barrier layers being alternatingly laminated with each other, the tunneling preventing layer preventing charge carriers in the active layer from tunneling into the superlattice structure, the light confinement structure producing an energy barrier higher than an energy barrier inherent to the well layers and the barrier layers for charge carriers injected into the active layer and producing a refractive index distribution that concentrates an electric field in the active layer, the light confinement structure being disposed in contact with the active layer.

3. In a quantum well semiconductor laser, a structure including a multi-quantum well structure active layer comprising a plurality of InGaAs well layers alternatingly laminated with a plurality of barrier layers, each barrier layer including two InP tunneling preventing layers each 5 nm thick and sandwiching two InGaAs layers each 2.1 nm thick that sandwich an InP layer 2.7 nm thick, the barrier layers producing an energy barrier higher than an energy barrier inherent to the semiconductor layers of the barrier layer for charge carriers injected into the well layers, the tunneling preventing layers preventing charge carriers in the well layers from tunneling into the barrier layers.

4. In a quantum well semiconductor laser, a structure including a multi-quantum well structure active layer comprising a plurality of InGaAs well layers alternatingly laminated with a plurality of barrier layers, each barrier layer including two InP tunneling preventing layers each 5 nm thick and sandwiching four InGaAs layers each 2.1 nm thick that are alternatingly laminated with three InP layer each 2.7 nm thick, the barrier layers producing an energy barrier higher than an energy barrier inherent to the semiconductor layers of the barrier layer for charge carriers injected into the well layers and the tunneling preventing layers preventing charge carriers in the well layers from tunneling into the barrier layers.

5. The quantum well laser structure of claim 1 wherein the tunneling preventing layer comprises InP and has a thickness of 20 nm and the superlattice structure includes ten well layers, each well layer having a thickness of 2.1 nm, and nine barrier layers, each barrier layer having a thickness of 2.7 nm laminated alternatingly with each other.

6. The quantum well laser structure of claim 2 wherein the tunneling preventing layer comprises InP and has a thickness of 20 nm and the superlattice structure includes ten well layers, each well layer having a thickness of 2.1 nm, and nine barrier layers, each barrier layer having a thickness of 2.7 nm laminated alternatingly with each other.

* * * * *

UNITED STATES PATENT AND TRADEMARK OFFICE
CERTIFICATE OF CORRECTION

PATENT NO. : 5,528,614
DATED : June 18, 1996
INVENTOR(S) : Watanabe

It is certified that error appears in the above-indentified patent and that said Letters Patent is hereby corrected as shown below:

Column 12, Line 25, change "8" to --6--.

Signed and Sealed this

Tenth Day of September, 1996

*Attest:*

BRUCE LEHMAN

*Attesting Officer*   Commissioner of Patents and Trademarks